(12) United States Patent
Katou

(10) Patent No.: US 7,622,362 B2
(45) Date of Patent: Nov. 24, 2009

(54) METHOD FOR MANUFACTURING SEMICONDUCTOR DEVICE

(75) Inventor: Hiroaki Katou, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 195 days.

(21) Appl. No.: 11/937,735

(22) Filed: Nov. 9, 2007

(65) Prior Publication Data

US 2008/0113490 A1   May 15, 2008

(30) Foreign Application Priority Data

Nov. 9, 2006   (JP) .............................. 2006-303562

(51) Int. Cl.
*H01L 21/30* (2006.01)
(52) U.S. Cl. ....................... 438/455; 438/458; 438/459; 257/E21.088
(58) Field of Classification Search ................. 438/455, 438/458, 459, 465; 257/620
See application file for complete search history.

(56) References Cited

U.S. PATENT DOCUMENTS

2002/0076902 A1* 6/2002 Geusic ........................ 438/455
2008/0315349 A1* 12/2008 Takei et al. .................. 257/506

FOREIGN PATENT DOCUMENTS

JP    5-346592    12/1993
JP    2006-5341    1/2006

* cited by examiner

*Primary Examiner*—Phat X Cao
*Assistant Examiner*—Nga Doan
(74) *Attorney, Agent, or Firm*—Young & Thompson

(57) ABSTRACT

According to the present invention, there is provided a method for manufacturing a semiconductor device that includes preparing a first semiconductor substrate and a second semiconductor substrate, forming a first insulating film on a surface of the first semiconductor substrate, forming circuit elements on a first surface of the second semiconductor substrate, grinding a second surface of the second semiconductor substrate, forming a second insulating film on the second surface of the second semiconductor substrate, and bonding the first insulating film and the second insulating film.

3 Claims, 2 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device having an SOI (silicon on insulator) structure.

2. Description of Related Art

As a semiconductor device having an SOI structure, an SOI substrate having a structure in which two wafers are bonded together is known. In such a structure, a wafer of a support substrate and a wafer of an active layer substrate are bonded together with a buried oxide film interposed therebetween.

On the other hand, in a general semiconductor device, impurities such as heavy metal have an adverse effect on device properties during a manufacturing process of the semiconductor device. Therefore, it is necessary to carry out a gettering to eliminate the impurities. In the general semiconductor device composed of a single silicon substrate, internal defects existing in the silicon substrate function as gettering sites for gettering metal impurities. However, in the above-described substrate having the SOI structure, the buried oxide film exists between the support substrate and the active layer substrate. Therefore, the impurities mixed during the manufacturing process do not diffuse into a lower portion of the buried oxide film, which makes it impossible to obtain sufficient gettering ability. FIG. 2 schematically shows this state.

As shown in FIG. 2, in a general Si substrate, the metal impurities can be trapped at the gettering sites formed in the Si. On the other hand, the buried oxide film in which diffusion coefficients of metals are small exists in the SOI substrate. Therefore, the metal impurities mixed into the active layer side are not trapped by the gettering sites on the support substrate side and the metal impurities are accumulated in a thin active layer region. When the accumulated metal impurities reach a gate oxide film, a gate oxide film defect occurs such as bonding leak or deterioration in withstand voltage of the gate oxide film. As a way to overcome this problem, Japanese Unexamined Patent Application Publication No. 2006-5341 discloses a technique that injects dopant for forming gettering sites in an active layer substrate.

In the technique disclosed in Japanese Unexamined Patent Application Publication No. 2006-5341, the gettering sites are formed in the active layer which forms a device. However, when the gettering sites are formed above the buried oxide film as in this technique, the withstand voltage deteriorates in the device having a fully-depleted SOI structure in which a depletion layer reaches the buried oxide film.

Another technique is disclosed in Japanese Unexamined Patent Application Publication No. 5-346592. In this technique, a silicon single crystal layer is thinned and a device such as a transistor is formed in this thinned layer. Japanese Unexamined Patent Application Publication No. 5-346592 discloses a technique for forming a TFT (Thin Film Transistor) by forming the device on a silicon wafer, thinning the silicon wafer, and then bonding the thinned silicon wafer to a glass substrate.

However, in the technique disclosed in Japanese Unexamined Patent Application Publication No. 5-346592, defects may occur in the single crystal silicon layer which is around an interface between the glass substrate and the single crystal silicon. Therefore, an increase in leak current or deterioration in withstand voltage of the device occurs in the device having a perfect depletion type structure as in the technique disclosed in Japanese Unexamined Patent Application Publication No. 2006-5341.

When the semiconductor device having the SOI structure is formed, the impurities that are mixed during the manufacturing process cannot sufficiently be gettered due to the provision of the buried oxide film, which may cause an adverse effect on the device properties.

SUMMARY

According to one aspect of the present invention, there is provided a method for manufacturing a semiconductor device that includes preparing a first semiconductor substrate and a second semiconductor substrate, forming a first insulating film on a surface of the first semiconductor substrate, forming circuit elements on a first surface of the second semiconductor substrate, grinding a second surface of the second semiconductor substrate, forming a second insulating film on the second surface of the second semiconductor substrate, and bonding the first insulating film and the second insulating film.

By using this method, it is possible to getter the impurities mixed during a manufacturing process without fail in order to manufacture the semiconductor device having the SOI structure.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
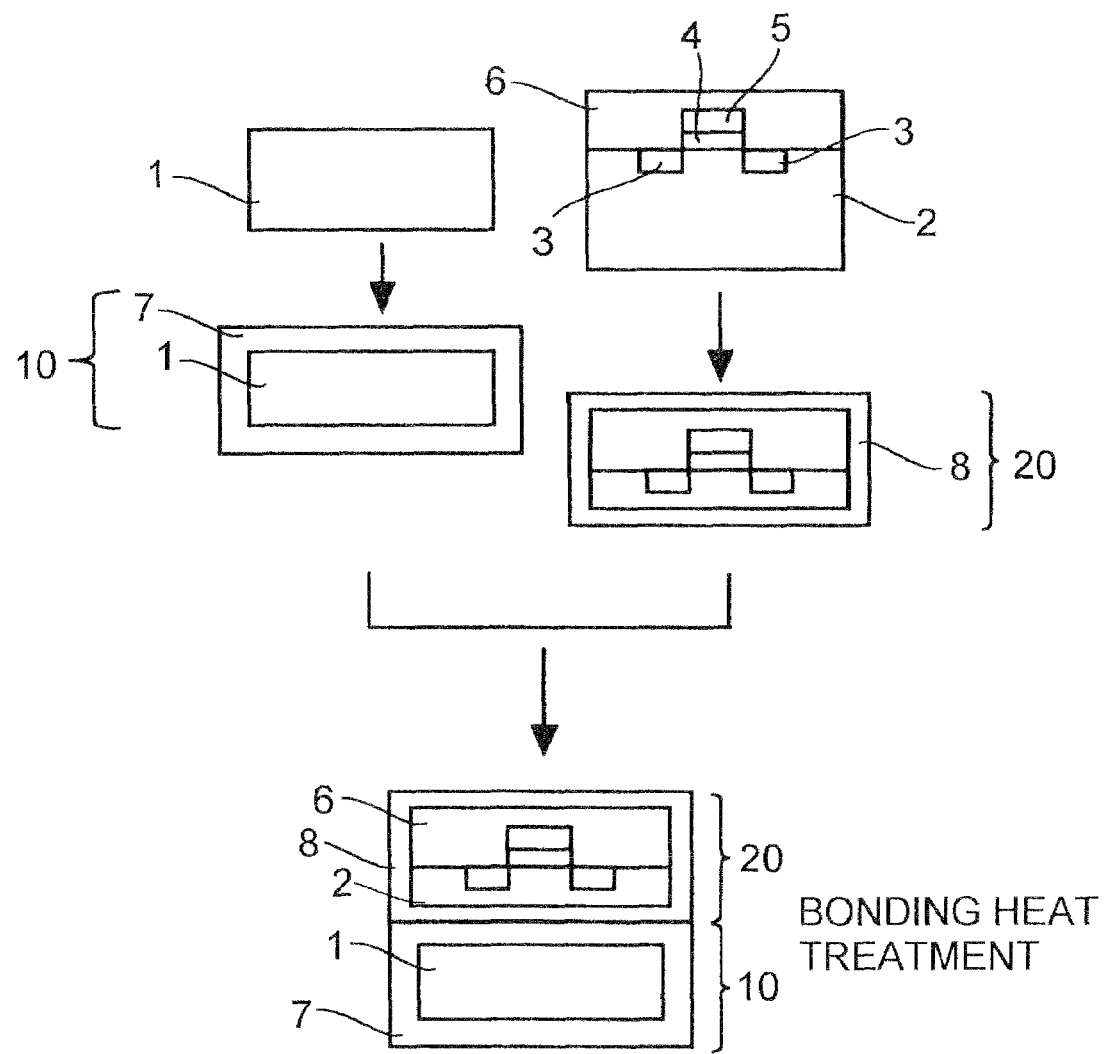
FIG. 1 shows a cross-sectional view showing a manufacturing process according to an embodiment 1 of the present invention.

The embodiment of the present invention will now be described with reference to the drawings. FIG. 1 is a cross-sectional view showing a manufacturing process according to the present embodiment. As shown in FIG. 1, a silicon substrate and an active layer substrate 20 are bonded together to manufacture a semiconductor device having an SOI structure. The silicon substrate becomes a support substrate 10 and a device is formed on the active layer substrate 20 in a later process. Each process shown in FIG. 1 will be described process by process.

In the present embodiment, a semiconductor substrate (silicon substrate) 1 and a semiconductor substrate (silicon substrate) 2 are prepared. The semiconductor substrate 1 becomes the support substrate 10 and the semiconductor substrate 2 becomes the active layer substrate 20 in the later process. The semiconductor substrate 1 which becomes the support substrate 10 has a thickness of several hundred µm, for example. The semiconductor substrate 2 which becomes the active layer substrate 20 also has a thickness of several hundred μm.

In this embodiment, various circuit elements such as transistor and capacitor are now formed on the semiconductor substrate 2 which becomes the active layer substrate 20. In other words, as in the general semiconductor device which does not employ the SOI structure, various processes are performed for forming a semiconductor integrated circuit. Those processes include forming an impurities diffusion layer 3 having a source drain region, a gate oxide film 4, a gate electrode 5, an interlayer insulating film 6 and the like on the semiconductor substrate 2.

On the other hand, heat treatment is performed on the semiconductor substrate 1 which becomes the support substrate 10. A heat oxide film 7 having a thickness of several μm is formed on a surface of the semiconductor substrate 1. The heat oxide film 7 serves as a buried oxide film when the heat oxide film 7 is bonded with the active layer substrate 20 to form the semiconductor device having the SOI structure. The support substrate 10 is formed by forming the oxide film 7 which serves as the buried oxide film on the surface of the semiconductor substrate 1.

Then a grinding process is performed on a back surface of the semiconductor substrate 2. Note that the device is not formed on the back surface of the semiconductor substrate 2. The semiconductor substrate 2 is grinded to a thickness of several μm by the grinding process.

Then the heat treatment is performed on the semiconductor substrate 2 for the active layer substrate which is grinded to a thickness of several μm in order to form an oxide film 8 on the surface of the semiconductor substrate 2. The oxide film 8 may have any thickness. All that is required here is that crystal defects do not occur in the semiconductor substrate 2 which becomes the active layer substrate 20 when the oxide film 8 formed on the semiconductor substrate 2 is bonded with the support substrate 10. Therefore, the heat treatment is performed at a temperature in a range of 300 to 850 degrees Celsius to form the oxide film of having a thickness of several angstrom on the back surface side on which the semiconductor substrate 2 is grinded. The substrate of which the heat oxide film is formed on the surface becomes the active layer substrate 20.

In the next step, the support layer substrate 10 and the back surface of the active layer substrate 20 are bonded together. Then the heat treatment is performed with keeping this bonding state to make the active layer substrate 20 fix to the support substrate 10. By performing the heat treatment, Si—O—Si bonding can be formed by dehydration reaction, and the semiconductor device having the SOI structure where the support substrate 10 and the active layer substrate 20 are fixed together can be formed. The heat treatment for the bonding process is carried out at low temperature so as not to deteriorate the properties of the circuit elements. The heat treatment is preferably carried out at a temperature in a range of 500 to 850 degree Celsius.

Figure 2:
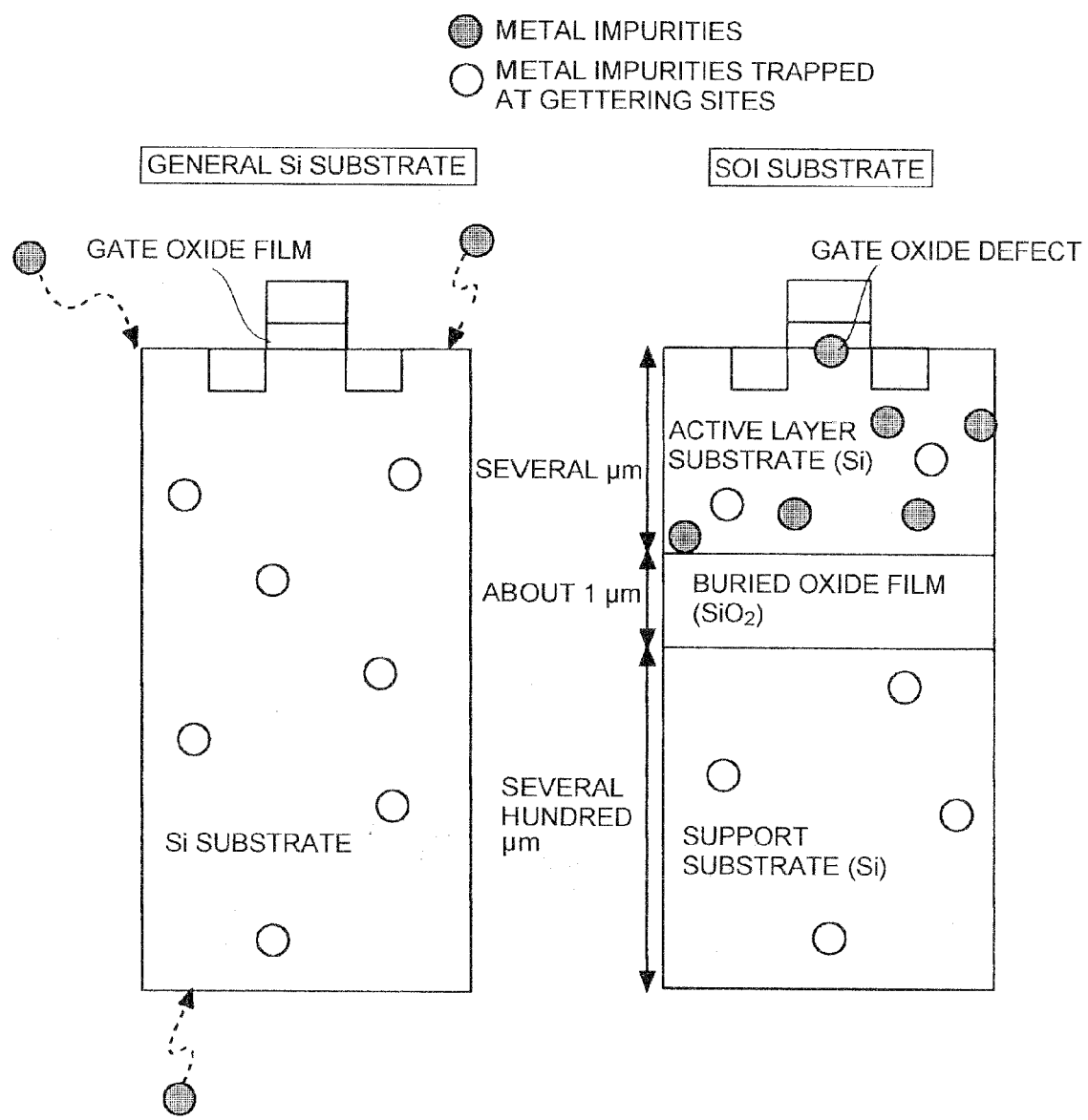
FIG. 2 is a view describing getterings of a general semiconductor substrate and a semiconductor substrate having an SOI structure.

As stated above, the circuit elements are formed on the general semiconductor substrate 2 which does not have the buried oxide film in this embodiment. As shown in FIG. 2, the diffusion of the metal impurities is not obstructed by the buried oxide film in this state and there are enough gettering sites for trapping the impurities. Therefore, the metal impurities can be trapped at the gettering sites of the semiconductor substrate 2 which becomes the active layer substrate 20. The active layer substrate 20 has a sufficient thickness even after each process for forming the device is performed. Therefore, the gate oxide film defect caused by the metal impurities does not occur. According to the present embodiment, the semiconductor substrate 2 on which the device is formed is grinded to a thickness of several μm and then the oxide film is formed on the back surface of the semiconductor substrate 2 by the heat treatment. Therefore, no defect is caused in the semiconductor (silicon) single crystal of the active layer substrate 20 when the support substrate 10 and the active layer substrate 20 are bonded together. Neither an increase in leak current nor deterioration in withstand voltage of the device occurs due to the defect caused in the active layer.

According to the present embodiment, the circuit elements are formed on the semiconductor substrate which has sufficient thickness. Then the semiconductor substrate is grinded and surface-oxidized to form the active layer substrate for bonding to the support substrate. Therefore, it is possible to form the semiconductor device having the SOI structure without causing deterioration in the gate oxide film by the metal impurities and deterioration in the withstand voltage due to the defect caused in the active layer on which the device is formed.

The above description is made only for illustration and the present invention is not limited to the above embodiment. For example, in the present embodiment, the heat oxide film is formed as the buried oxide film. However, the buried oxide film may be made of any insulator such as CVD oxide film or CVD nitride film to manufacture the semiconductor device having the SOI structure. It will be possible for a person skilled in the art to readily change, add, and transform each element of the present embodiment without departing from the scope of the present invention.

It is apparent that the present invention is not limited to the above embodiment, but may be modified and changed without departing from the scope and spirit of the invention.

What is claimed is:

1. A method for manufacturing a semiconductor device, comprising:

preparing a first semiconductor substrate and a second semiconductor substrate;

forming a first insulating film on a surface of the first semiconductor substrate;

forming circuit elements on a first surface of the second semiconductor substrate;

grinding a second surface of the second semiconductor substrate;

forming a second insulating film on the second surface of the second semiconductor substrate; and bonding the first insulating film and the second insulating film.

2. The method for manufacturing the semiconductor device according to claim 1, wherein a heat treatment is performed after the first insulating film and the second insulating film are bonded together.

3. The method for manufacturing the semiconductor device according to claim 2, wherein the heat treatment is performed under a condition that characteristics of the circuit element on the first surface of the second semiconductor substrate are not deteriorated.

* * * * *